United States Patent [19]

MacDonald

[11] Patent Number: 4,610,006
[45] Date of Patent: Sep. 2, 1986

[54] AUTOMATIC CONTROL SYSTEM FOR ACOUSTIC LOGGING

[75] Inventor: Clyde O. MacDonald, Houston, Tex.

[73] Assignee: Halliburton Company, Duncan, Okla.

[21] Appl. No.: 560,294

[22] Filed: Dec. 12, 1983

[51] Int. Cl.⁴ .................. H03G 3/30; G01V 13/00
[52] U.S. Cl. ........................... 367/65; 367/66; 330/279; 330/129
[58] Field of Search .............. 367/65, 66, 67, 27, 367/29, 98; 343/7 AG; 455/234, 239, 240; 330/279, 129

[56] References Cited

U.S. PATENT DOCUMENTS

| | | | |
|---|---|---|---|
| 3,394,315 | 7/1968 | Gray | 455/239 |
| 3,488,604 | 1/1970 | Smilowitz | 330/279 |
| 3,958,213 | 5/1976 | Scott et al. | 367/67 |
| 4,463,320 | 7/1984 | Dawson | 330/279 |
| 4,527,148 | 7/1985 | Kuboki et al. | 367/67 |

*Primary Examiner*—Thomas H. Tarcza
*Assistant Examiner*—Daniel T. Pihulic
*Attorney, Agent, or Firm*—William J. Beard

[57] ABSTRACT

A circuit is disclosed for use in an acoustic logging tool incorporating a transmitter sending an acoustic pulse which is received by acoustic receivers. In the preferred and illustrated embodiment hereof, an automatic gain control (AGC) circuit controls the receiver amplification to enable the output range to be limited for input to a digital graphic recorder, typically having a limited number of output signal levels, coordinating with data processing equipment. The AGC times the peak operation to thereby limit the dynamic range.

3 Claims, 3 Drawing Figures

AUTOMATIC CONTROL SYSTEM FOR ACOUSTIC LOGGING

BACKGROUND OF THE DISCLOSURE

This apparatus is directed to an AGC for use in an acoustic logging tool. This type of tool features an acoustic pulse transmitter. Acoustic pulses are transmitted into the well fluid and pass into the adjacent formations. Acoustic signals are observed at receivers mounted on the logging tool. Typically, more than one acoustic receiver is used. One arrangement features a first spaced receiver and an identical receiver which is spaced even further away from the acoustic transmitter. This receiver system enables a comparison to be made between the received signals at the two receivers. Data reduction is simplifier by procedure which is known as acoustic amplitude ratio logging. This involves the use of signals from two acoustic receivers. The ratio of the signals is more important than the absolute valves in this two receiver system. Other data processing procedures involving the signal from a single receiver are enhanced by the AGC of the present disclosure.

The method of operation of an acoustic logging tool normally involves the propagation of an acoustic burst transmitted from a piezoelectric or magnetostrictive transducer. The transmitted pulse is typically very short. The signal at receivers in the acoustic logging tool has a wide dynamic range. The pulse return to the receiver is relatively dynamic in light of this fact. Typically, the dynamic range of the received signal is quite wide, easily having a range of 1,000 fold or greater.

While it is possible to utilize AGC circuits with dynamic ranges up to one million to one, it is equally difficult to have only a limited AGC gain range to accommodate a wide dynamic range. Such a limit is in part imposed by data processing apparatus. One such requirement arises in the display of the received data in a display form utilizing the system known as Micro-Seismogram, a service mark identifying such a display system. A typical range of data presentation is about 16 gray levels. This data handling format has achieved a high degree of popularity.

To accommodate the more limited dynamic range exemplified by 16 levels, or any other limited dynamic range, the AGC system must provide a relatively limited response. It is desirable that the AGC have a limited dynamic range. In addition to that, this apparatus limits the dynamic range only for a specified interval or window of time. The window is tied to the event being observed. In this instance, it is preferably to determine the window based on the incoming signal at the receiver. With this in mind, a window is thus defined based on increase in the signal at the receiver, thereby outputting data in a compressed data range where the time window limits the operation of the circuit to a time when data is more relevant. Extraneous or system noise occurs between signals and is blanked off by the time window determined by the circuit, thereby limiting operation of the equipment only to those intervals at which time signal data will be processed.

The present apparatus is summarized as an AGC control circuit including an input operational amplifier with a suitable full wave rectifier. The rectified positive and negative peaks are amplified and applied to the output of the circuit. Peaks are then detected by a peak detector, including both positive and negative peaks. This output is supplied through an amplifier then to a sample and hold amplifier. The sample and hold amplifier forms a feedback control signal applied to the input amplifier, altering its gain and hence the gain of the closed feedback loop.

BRIEF DESCRIPTION OF DRAWINGS

So that the manner in which the above recited features, advantages and objects of the present invention are attained and can be understood in detail, more particular description of the invention, briefly summarized above, may be had by reference to the embodiments thereof which are illustrated in the appended drawings.

It is to be noted, however, that the appended drawings illustrate only typical embodiments of this invention and are therefore not to be considered limiting of its scope, for the invention may admit to other equally effective embodiments.

DETAILED DESCRIPTION OF THE PREFERRED EMBODIMENTS

Figure 1:
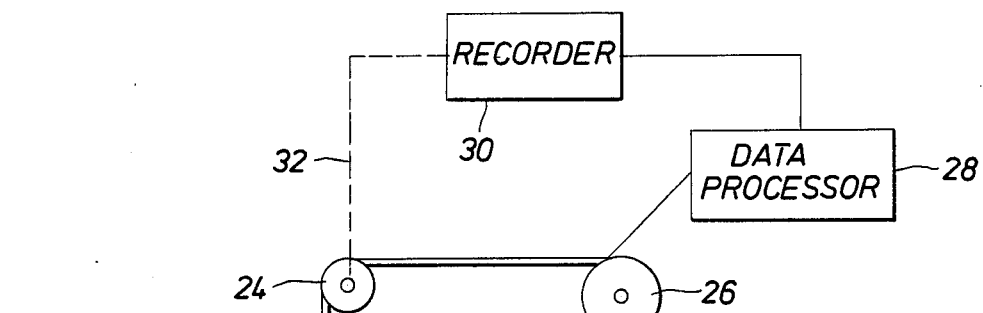
FIG. 1 is a view of an acoustic well logging tool in a well bore including an acoustic transmitter and several acoustic receivers.

Attention is directed to FIG. 1 of the drawings. In FIG. 1, an acoustic well logging tool 10 is suspended in a well bore 12. It is supported on a logging cable 14 which incorporates suitable electrical conductors extending to the surface to operate the acoustic logging tool 10. The tool 10 is lowered to the bottom of the well to enable data to be gathered through the use and operation of the tool. Briefly, the tool is operated as it is raised along the well borehole 12 to obtain acoustic data. The acoustic logging tool is constructed with a transmitter 16 which transmits acoustic pulses into the adjacent formation. There are several receivers on the acoustic logging tool 10. One is receiver 18 at the upper end. In addition, there is a lower receiver 20 and a receiver 22 which is located even further along the tool. The receivers are generally similar in construction and operate in substantially the same fashion. That is, an acoustic pulse of a few milliseconds duration is transmitted into the formation adjacent to the transmitter 16 and a received signal is observed at the various receivers. The signals that are observed indicate the nature of the formations along the signal propagation path.

A sheave 24 supports the logging cable 14. The cable is stored on a supply drum or reel 26. A logging cable is typically longer then the well and are commonly as long as 25,000 feet. The logging cable is connected by means of suitable conductors with a data processing apparatus 28. The data is processed and provided to a data recorder 30. A mechanical or electronic depth measuring system connected to the sheave 24 is identified at 32 and it provides the depth of the logging tool 10 in the well to the recorder 30. This enables the data to be recorded as a function of depth.

Figure 2:
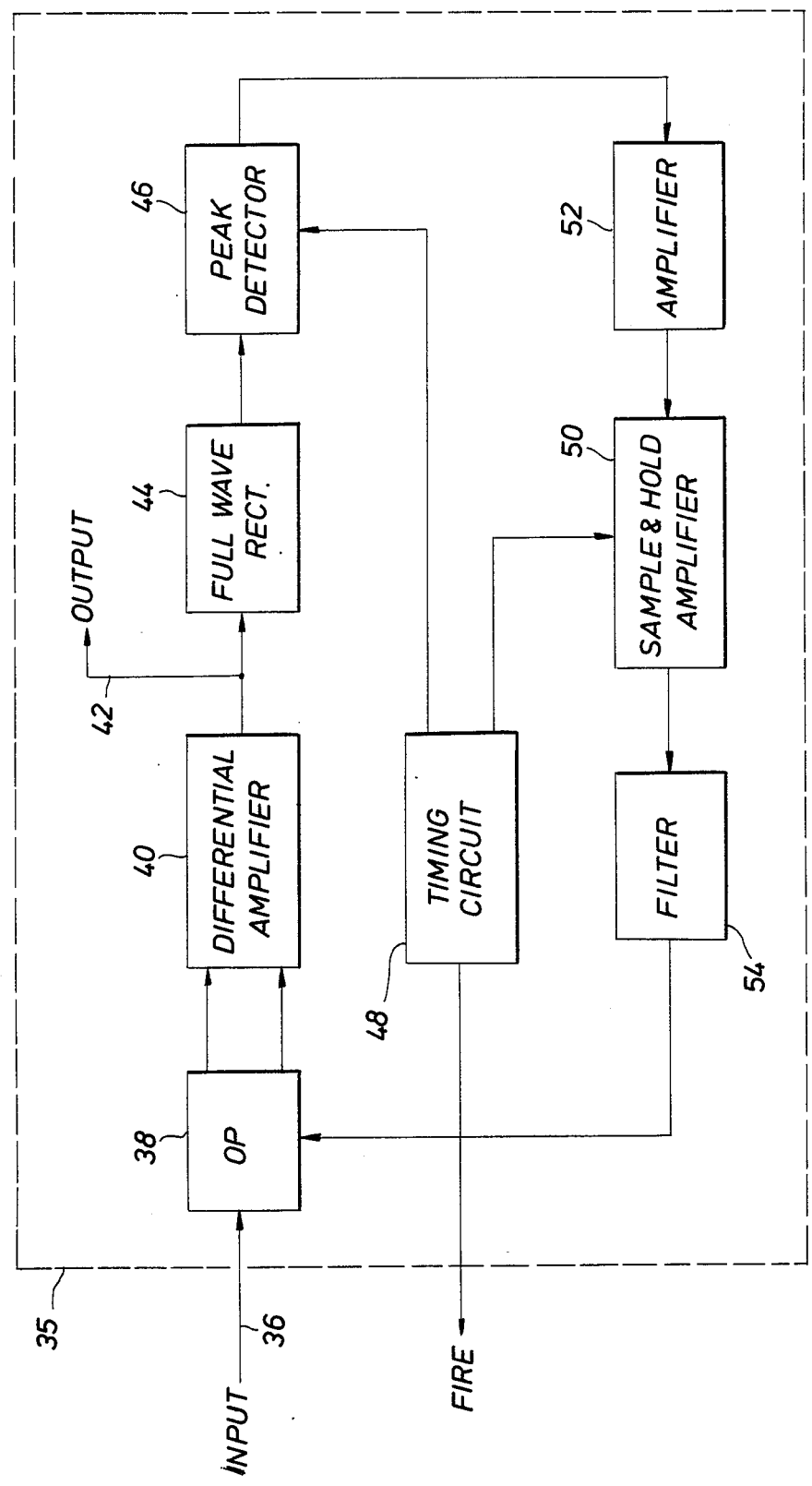
FIG. 2 is a schematic block diagram of an automatic gain control circuit for use with an acoustic receiver in the logging tool shown in FIG. 1.

Going now to FIG. 2, it should be recalled that the output of each receiver is a pulse occurring after the transmitted pulse. The pulse has a duration and shape determined by the formations along the path of propagation from transmitter to receiver. In FIG. 2, the input 36 is from one of the receivers to the system 35. The pulse is supplied to an AGC operational amplifier 38. This amplifier has an input gain control signal which controls the gain of the amplifier 38. The amplifier 38 forms an output which is proportional to the gain and input signal. The output has the form of a signal applied on two conductors to a differential amplifier 40. This amplifier forms an output on a conductor 42 which is the output of the system. The system however includes a feedback loop which is connected from the output to obtain the AGC function. The feedback loop incorporates a fuell wave rectifier 44. The system is therefore able to handle both positive and negative signals. They are rectified, thereby forming a procession of pulses from the full wave rectifier and which pulses are input to the peak detector 46. The peak detector 46 detects a specified peak during its operation. If it operates for the entire cycle of the pulse train input to the detector 46, it will normally select the largest peak. The duration of opration of the peak detector is controlled by a timing circuit 48 to be described in detail hereinafter. The timing circuit forms a single input to the peak detector 46 which gates the detector 46 off and on. The detector 46 is held on for a specified interval, thereby defining the portion of the received data to be evaluated for peak value. The peak signal is detected and supplied through an amplifier and input to a sample and hold amplifier 50. An amplifier 52 is at the input of the amplifier 50. The sample and hold amplifier 50 is operated at a timed moment. It is operated for a specified interval as determined by the timing circuit 48.

The timing circuit 48 triggers the sample and hold amplifier 50 to operate to thereby fix a specified output signal. This output signal is supplied to a filter circuit 54. This circuit limits the harmonic content of the sample and hold signal passed through it; in fact, the filter provides a signal passband as a function of frequency, thereby enabling the filter circuit 54 to determine a feedback signal to be applied to the AGC operational amplifier 38. The operational amplifier 38 is operated at gain level determined by the gain control signal input to it.

Consider some examples of operation. Assume that the transmitted pulses have a uniform length of N time units. Assume that it is stretched to propagation to a length of 4N. Assume further that the information of interest is located after a time of 3N. In this event, the timing circuit 48 operates the peak detector for a specified time interval of sufficient length to observe the data of interest. The timing circuit 48 will operate the sample and hold amplifier 50 to evaluate only the portion of the received signal which has data of interest. The timing circuit 48 causes the sample and hold circuit 50 to form a feedback signal which is applied by the feedback loop to the AGC operational amplifier 38, thereby regulating the timing of its operation to the specified interval. This timed operation then limits the dynamic range of the feedback loop. While the received signal may have a dynamic range from the smallest readible input to the largest peak of 1,000 times larger or perhaps even greater, the range exceeds the dynamic range of some data reduction or data handling systems. Through the use of this apparatus, the specified interval of interest is located and the gain of the system is controlled in that interval so that the signal dynamic range is within specified limits. To cooperate with the equipment featuring the Micro-Seisogram, it is desirable that the output data have sixteen gray levels. This limited response range enables the sixteen levels to be obtained.

Figure 3:
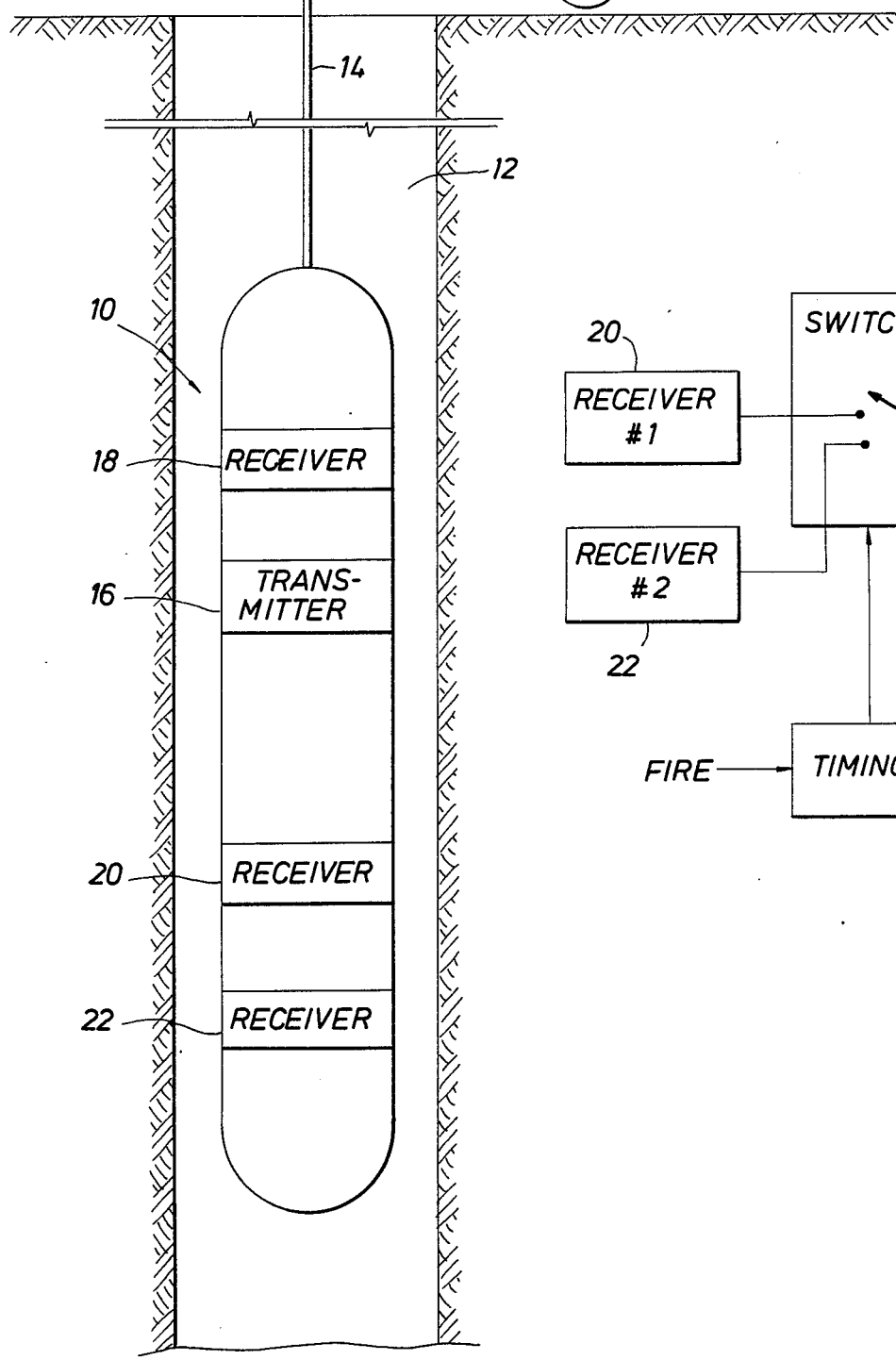
FIG. 3 discloses an alternate block diagram schematic of an AGC circuit modified for cooperation with two receivers to provide a ratio of the signals.
Figure 3:
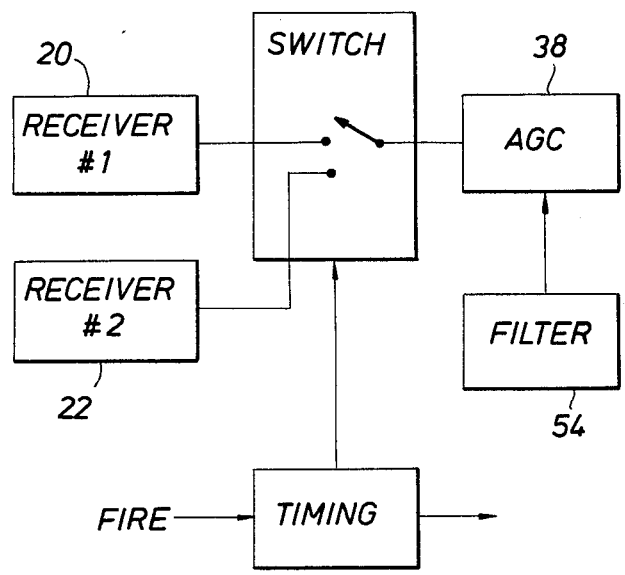

Attention is next directed to FIG. 3 of the drawings. There, two receivers are shown. They are conveniently the receivers 20 and 22 shown in FIG. 1. They form input signals to the same AGC circuit shown in FIG. 2 and which is now found in FIG. 3. That circuit was previously identified as the AGC system 35. Again, in FIG. 3 the system 35 is included. It is arranged somewhat differently. There are two input signals, one each from the receivers 20 and 22. That is, the output signals from the receivers 20 and 22 are input to the AGC operational amplifier 40. The filter 54 is also shown in FIG. 3. In like fashion, the timing circuit 48 is connected to a timed source. The timing or firing signal is timed by receiver operation. In this instance, it is connected to the receiver 20 as a trigger source.

In FIG. 3, the switched signals for the AGC are processed wherein the gain of the AGC circuit is set by the signal from the first receiver and the gain is held at the same level for the signal for the second receiver. At each transmitter firing, the switch alternates, passing alternate signals from the two receivers.

The foregoing sets forth one embodiment of the AGC control system and an alternate arrangement in which it is used with different inputs. Modifications can be accommodated without departing from the structure which is set forth. For instance, one modification is substitution of a halfway rectifier for the full rectifier. This can be done where the signal of interest is substantially unidirectional. The peak detector 46 is typically gated by the timing circuit 48. The gating signal is variable in the system as shown. If circumstances permit, it can be fixed by the time of the transmitted pulse. That is, the timing circuit 48 might be simplified by simply tying the input of the timing circuit 48 to the acoustic pulse transmitter, thereby timing operation of the AGC control system of this invention on occurrence of a transmitted pulse. Another important factor is to note the incorporation of the filter 54. This limits the frequency content input to the AGC operational amplifier. This limitation prevents destabilized operation of the feedback loop as a result of feeding excessive rate of change through the feedback loop, thereby altering the gain in an uncontrollable fashion.

While the foregoing sets forth the preferred embodiment, the scope is determined by the claims which follow.

What is claimed is:

1. An automatic gain control system for use in an acoustic well logging system having an acoustic transmitter for transmitting acoustic pulses in a well borehole and a plurality of longitudinally spaced apart acoustic receivers for receiving acoustic pulses traversing the well borehole and the earth formations between said transmitter and each of said receivers, said automatic gain control system comprising:

means for inputting signals from at least one of said acoustic receivers to a gain controlled operational amplifier, said operational amplifier having at least one input acoustic signal terminal and a feedback control signal input terminal;

differential amplifier means connected to the output of said gain controlled operational amplifier for amplifying the output of said operational amplifier and providing a system output acoustic signal and for providing a sample output signal to a feedback control signal generating loop circuit;

a timing circuit for providing reset signals a predetermined length of time following each successive acoustic pulse from said acoustic transmitter, the time interval between said acoustic pulses and said reset signals defining an operating cycle of the automatic gain control system;

full wave rectifying means responsive to the output of said differential amplifying means for generating a pulsating D.C. signal representative of said differential amplifier sample output signal;

peak detector means responsive to said pulsating D.C. signal and to said reset signal from said timing circuit for generating a peak output signal representative of the peak value of said pulsating D.C. signal in said operating cycle of the automatic gain control system;

sample and hold amplifier means having an input connected to the output of said peak detector means for holding and providing an output representative of said peak signal representative of the peak value of said pulsating D.C. signal; and filter means having an input terminal connected to the output of said sample and hold amplifier to limit the high frequency content of said output signal, said filter having an output connected to said feedback control terminal of said gain controlled operational amplifier to thereby provide a gain control signal thereto.

2. The system of claim 1 and further including means for multiplexing several acoustic receiver output signals as inputs to said gain controlled operational amplifier.

3. The system of claim 1 wherein two acoustic receiver signals are simultaneously input to multiple input terminals of said gain controlled operational amplifier and the output signal therefrom comprises a signal representative of the amplitude ratio of said two acoustic receiver signals.

* * * * *